United States Patent
Magnussen et al.

(10) Patent No.: US 11,690,189 B2
(45) Date of Patent: Jun. 27, 2023

(54) FLUID MEASURING OR FLUID CONTROL DEVICE

(71) Applicants: Buerkert Werke GmbH & Co. KG, Ingelfingen (DE); Burkert S.A.S., Triembach-au-Val (FR)

(72) Inventors: Jan Magnussen, Ingelfingen (DE); Lukas Ungerer, Ingelfingen (DE); Markus Herrmann, Ingelfingen (DE); Jürgen Wiedemann, Ingelfingen (DE)

(73) Assignees: Buerkert Werke GmbH & Co. KG, Ingelfingen (DE); Burkert S.A.S., Triembach-au-Val (FR)

( * ) Notice: Subject to any disclaimer, the term of this patent is extended or adjusted under 35 U.S.C. 154(b) by 107 days.

(21) Appl. No.: 17/505,532

(22) Filed: Oct. 19, 2021

(65) Prior Publication Data

US 2022/0124929 A1    Apr. 21, 2022

(30) Foreign Application Priority Data

Oct. 20, 2020   (DE) ..................... 10 2020 127 624.9

(51) Int. Cl.
*H05K 5/06*    (2006.01)
*H05K 5/00*    (2006.01)

(52) U.S. Cl.
CPC ........... *H05K 5/061* (2013.01); *H05K 5/0008* (2013.01); *H05K 5/069* (2013.01)

(58) Field of Classification Search
CPC ........ H05K 5/06; H05K 5/061; H05K 5/0008; H05K 5/069; F16B 23/00; F16B 23/0007; F16B 23/0053; F16B 35/04; F16B 35/041; F16B 35/048
See application file for complete search history.

(56) References Cited

U.S. PATENT DOCUMENTS

| 4,167,355 | A | 9/1979 | Hansson |
| 6,027,279 | A | 2/2000 | Skjaeveland |
| 7,716,805 | B2 * | 5/2010 | Hommel ............... F16B 35/048 |
| | | | 411/399 |
| 9,638,562 | B2 | 5/2017 | Wiedemann et al. |

(Continued)

FOREIGN PATENT DOCUMENTS

| CN | 203463463 U | 3/2014 |
| DE | 2757479 A1 | 6/1978 |

(Continued)

*Primary Examiner* — Hoa C Nguyen
*Assistant Examiner* — Amol H Patel
(74) *Attorney, Agent, or Firm* — Dilworth IP, LLC

(57) ABSTRACT

A fluid measuring or fluid control device has a housing the housing parts of which are fastened to each other by at least one screwed connection, in which a screw engages through an opening in a peripheral wall of the first housing part and is screwed into a threaded opening in the second housing part. An elastic seal is arranged between the housing parts. The first housing part has a first resting face, and the second housing part has a second resting face which are both in peripherally circumferential contact with the seal. The screw shank and an edge of the opening have cooperating frusto-conical surfaces which are oriented such that the second housing part is displaced in the direction towards the first housing part when the screw is screwed into the threaded opening, the resting faces coming into contact with the seal.

10 Claims, 4 Drawing Sheets

(56) References Cited

U.S. PATENT DOCUMENTS

| | | | | |
|---|---|---|---|---|
| 2005/0220565 | A1* | 10/2005 | Hommel | F16B 35/048 |
| | | | | 411/399 |
| 2008/0165516 | A1* | 7/2008 | Pruss | H05K 5/061 |
| | | | | 361/800 |
| 2015/0280358 | A1 | 10/2015 | Wiedemann et al. | |
| 2021/0227712 | A1* | 7/2021 | Goehl | H05K 5/061 |
| 2023/0035552 | A1* | 2/2023 | Betz | H05K 5/0004 |

FOREIGN PATENT DOCUMENTS

| | | | | |
|---|---|---|---|---|
| DE | 3233708 T5 | 12/1984 | | |
| DE | 3516838 A1 | 11/1986 | | |
| DE | 4343676 A1 | 6/1995 | | |
| DE | 69027027 T2 | 9/1996 | | |
| DE | 19847269 C1 | 3/2000 | | |
| DE | 102014104211 A1 * | 10/2015 | | G01F 15/14 |
| DE | 102014104211 A1 | 10/2015 | | |
| DE | 102015211360 A1 * | 12/2016 | | F16B 31/02 |
| DE | 102016117339 A1 | 3/2017 | | |
| DE | 102020001493 A1 | 10/2020 | | |
| EP | 0959330 B1 | 11/1999 | | |
| GB | 2106210 B | 3/1985 | | |

\* cited by examiner

FLUID MEASURING OR FLUID CONTROL DEVICE

FIELD OF THE INVENTION

The invention relates to a fluid measuring or fluid control device.

BACKGROUND

In many installation situations, devices comprising electronic components are to be protected against environmental impacts such as splashing water. The aim is often to achieve, for example, a protection against dust and jets of water from any angle in accordance with the protection rating IP65 or even against a temporary immersion in accordance with the protection rating IP67.

The object of the invention is to provide a compact fluid measuring or fluid control device having a sealed housing.

SUMMARY

The invention provides a fluid measuring or fluid control device, having a housing including a first and a second housing part fastened to each other by at least one screwed connection, the screwed connection comprising a screw having a screw shank and a screw head, an opening in a peripheral wall of the first housing part through which the screw shank engages, and a threaded opening in the second housing part which receives the screw shank. An elastic seal having a peripherally circumferential edge region is arranged between the housing parts. The first housing part has a first resting face and the second housing part has a second resting face, wherein in a non-assembled initial position, one of the housing parts has its resting face resting against the seal. The screw shank and an edge of the opening have cooperating frustoconical surfaces. In the initial position, the opening in the peripheral wall and the threaded opening are radially offset to each other with their central axes, and the frustoconical surfaces are oriented such that when the screw is screwed-in, the frustoconical surfaces displace the two housing parts laterally to each other so that the resting face presses against and elastically deforms the seal.

The frustoconical surfaces slide against each other such that the second housing part is displaced in a displacement direction in a direction towards the first housing part by a displacement path when the screw in screwed into the threaded opening. When the screwed connection is tightened, the second housing part is pulled towards the first housing part by the frustoconical surfaces sliding against each other, as a result of which in a fully tightened position of the screwed connection, a sufficient clamping force for a sealed connection between the two housing parts may be applied onto the seal.

In the fully tightened position, the frustoconical surfaces on the screw shank and on the edge of the opening rest against each other over the entire periphery in a planar manner or at least along a line.

Advantageously, both resting faces then rest on opposite sides of the seal at least with a peripherally circumferential line contact about a longitudinal axis of the housing to achieve a sealing over the entire periphery of the housing.

The displacement path travelled by the second housing part in relation to the first housing part until the screwed connection has reached its fully tightened position is determined by the length of the frustoconical surface on the screw shank or on the edge of the opening and by the angle of the frustoconical surfaces. A distance of about 1 to 3 mm may in particular be chosen as a displacement path.

The angle of the frustoconical surfaces may for example be about 30° with respect to a longitudinal axis of the screw or the opening, wherein both frustoconical surfaces should have the same inclination angle.

The screwed connection can easily be formed such that the fully tightened position is always reached and not exceeded, so that the reached clamping force is identical for each tightening of the screwed connection. The clamping force is thus reproducible, which also makes it possible to open and close the housing multiple times to carry out maintenance works, for example.

In one preferred embodiment, the housing is generally cylindrical, in particular approximately cuboid, and the screw shank extends perpendicularly to the longitudinal axis of the housing, whereas the displacement path is parallel to the longitudinal axis.

To mount the two housing parts to each other, the second housing part is placed onto the first housing part in the initial position in which the frustoconical surface of the screw is preferably already in contact with the frustoconical surface of the opening on the side facing the second housing part, but is still spaced apart from the frustoconical surface of the opening on the side facing away from the second housing part.

In this position, the screw is plugged through the opening and is screwed into the threaded opening.

When the screw is tightened in the fully tightened position, and during the resulting displacement of the second housing part in the direction towards the first housing part, the distance between the frustoconical surface of the screw and the frustoconical surface of the opening on the side facing away from the second housing side decreases until the two frustoconical surfaces are in contact with each other in a peripherally circumferential manner.

In the fitted position, the opening and the threaded opening are not aligned coaxially with each other; rather, the center of the opening is offset with respect to the center of the threaded opening in the direction away from the second component along the longitudinal axis of the housing by the displacement path. However, in the fully tightened position, the opening and the threaded opening are coaxially aligned.

The outer contour of the edge region of the seal should be adapted to the housing cross-section, for example a rectangular contour for a cuboid housing.

A flat seal, an O-ring seal but also a molded seal made of an appropriate sealing material, in particular an elastomer, may be selected as a seal.

Preferably, a reversible deformation of the seal occurs, such that the housing can be opened several times and closed again in a sealed manner.

The first resting face on the first housing part is for example a peripherally circumferential projection, which engages into the seal in the fully tightened position of the screwed connection. It is thus easily possible to obtain a pressing of the resting face into the seal when the screwed connection is tightened.

To this end, the projection should be aligned along the relative direction of displacement of the housing parts relative to each other and thus in particular extend along the longitudinal axis of the housing.

The projection may for example have a rectangular, rounded or chamfered cross-section, which allows a simple penetration of the projection into the seal such that the material of the seal can easily engage around the projection and thus further improve the sealing effect.

The displacement path of the housing parts from the initial position up to the fully tightened position is advantageously larger than the extension of the projection along the displacement direction such that the projection can engage in a controlled manner into the seal. In this way, the second housing part can be placed onto the first housing part without any contact between the seal and the projection. The projection does not come into engagement with the seal until the screw is tightened.

The second resting face on the second housing part may be a peripherally circumferential annular groove, for example, into which the seal is inserted. The annular groove in particular has a U-shaped cross-section.

The seal should have a certain play in the annular groove to provide space for a change in the cross-sectional shape of the seal by a force impact when the screwed connection is closed.

For example, the annular groove is arranged in a peripheral wall of the first housing part directly adjacent to an exterior side of the first housing part.

Alternatively, the first resting face may of course be configured as a groove and the second resting face as a projection. It would also be possible to provide a projection as a resting face on both housing parts.

A recess, in particular a counterbore, is for example provided in the peripheral wall of the first housing part, which is wider than the screw head in the displacement direction and has at least the dimension of the diameter of the screw head plus the displacement path. Such a recess may serve to countersink the screw head with respect to the surface of the peripheral wall of the first housing part. Furthermore, a stop which correlates with the fully tightened position of the screwed connection may be formed via the rest of the screw head at the bottom of the recess.

The distance between the first resting face and the seal may easily be specified by the choice of the distance between the threaded opening and the seal or the annular groove forming the second resting face.

Preferably, the frustoconical surface on the screw shank is arranged between the screw head and a threaded section of the screw shank, such that the screw head merges into the threaded section via the frustoconical surface, the threaded section being screwed into the threaded opening.

A plurality of screwed connections is preferably provided along the periphery of the first housing part to obtain a uniform clamping force and thus a good sealing effect between the first and the second housing part. A total of four screwed connections may for example be provided, which are in particular arranged in pairs on both sides of the first housing part.

In one possible embodiment, the threaded opening in the second housing part is provided in a fastening block, which extends into the interior of the first housing part when the second housing part is placed onto the first housing part in the initial position.

It is advantageous here, if two screwed connections are respectively arranged opposite each other on parallel broad sides of the first housing part, such that they can use the same fastening block.

It is generally advantageous, if the screw shank extends perpendicularly to the longitudinal direction of the housing as relatively short screws can be used in this case, which reduces costs, as it is possible, for example, to dispense with special designs for particularly long screws.

In one possible embodiment, a seal is provided on the screw head on the screw. Preferably, the seal is present in addition to the annular seal between the two housing parts. This seal may for example be an O-ring which surrounds the screw shank and may be received in a groove on the underside of the screw head. This permits a double sealing of the two housing parts relative to each other, the opening for the screw being also sealed in addition to the edge of the two housing parts.

A further counterbore may be provided, which directly adjoins the frustoconical surface of the opening and accommodates an excess sealing volume of the seal on the screw head.

Generally, a multistage depression may be produced in the peripheral wall of the first housing part around the opening to realize first the frustoconical surface on the edge of the opening, then a first counterbore for the O-ring, and then a second counterbore for accommodating the screw head, in the radial direction from the inside to the outside.

For example, the first housing part is a housing body and the second housing part is a cover, which closes the housing body from the environment. It is possible to manufacture the first housing part as an extruded profile. The second housing part is for example milled or a die-cast part.

The threaded opening in particular extends parallel to a cover surface of the second housing part which is perpendicular to the peripheral wall of the first housing part, the fastening block being adapted to protrude from the cover surface.

In one preferred embodiment, the fluid measuring or fluid control device is a mass flow meter in accordance with the Coriolis principle, including two fluid connections and a measuring tube through which fluid flows and which fluidically connects the two fluid connections to each other. The cover in particular closes the housing on a side opposite the fluid connections.

The housing described here may of course be used for any suitable fluid measuring or fluid control device when a sealed connection of two housing parts is advantageous.

The use of screwed connections which cause a movement of the second housing part relative to the first housing part when tightened permits in a simple manner the realization of a sealed connection between the two housing parts in that resting faces on both housing parts come into circumferential contact with the seal.

DETAILED DESCRIPTION

Figure 1:
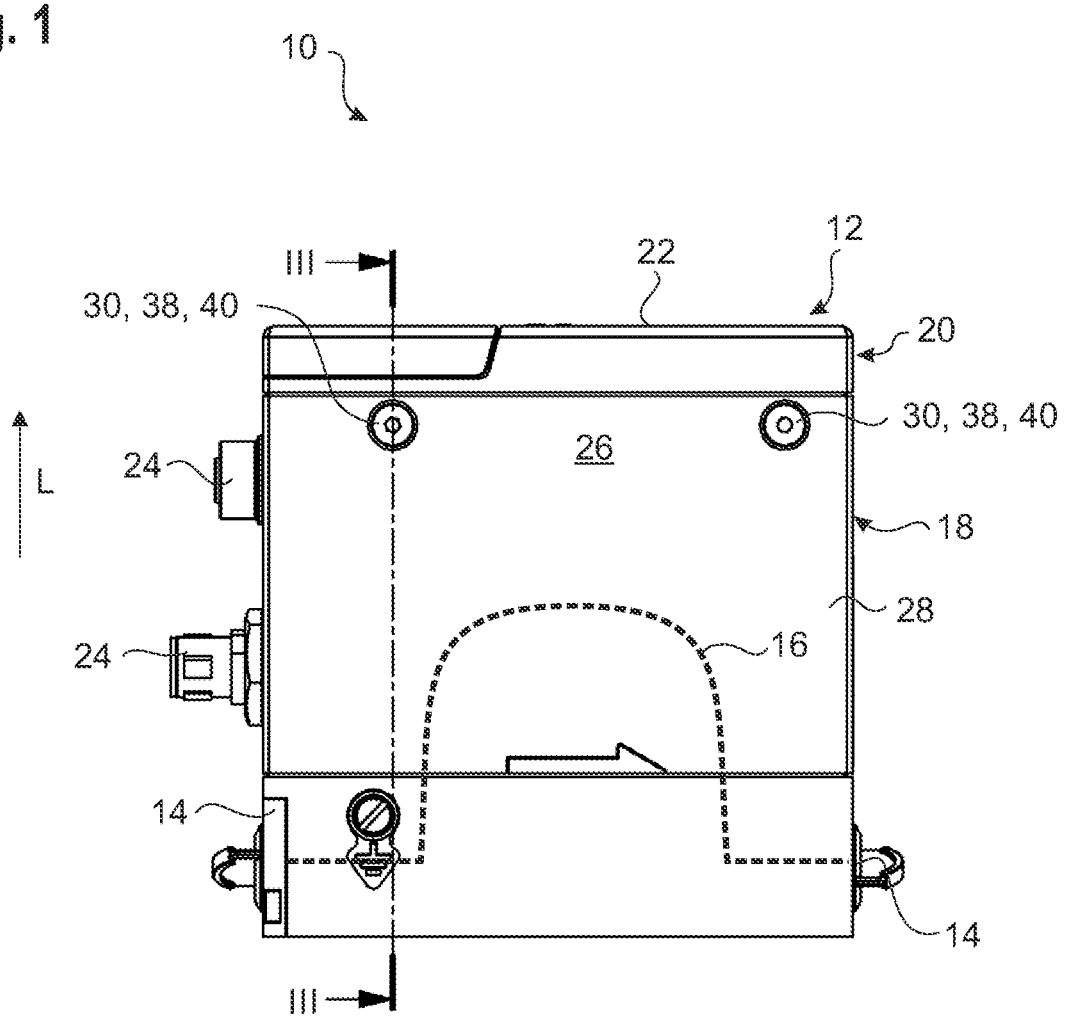
FIG. 1 is a schematic lateral view of a fluid measuring or fluid control device according to the invention.
Figure 2:
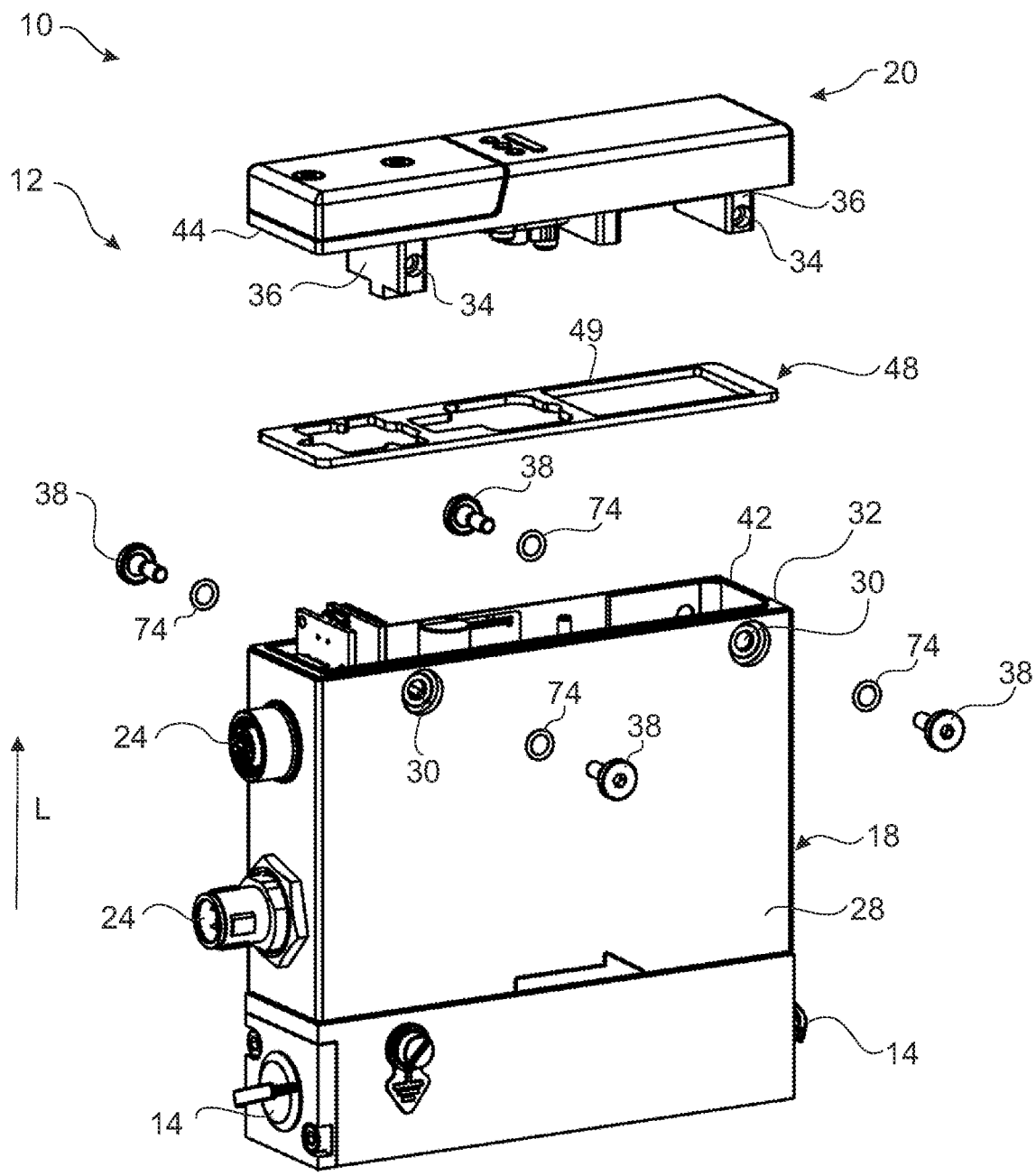
FIG. 2 is a schematic perspective exploded view of the fluid measuring or fluid control device from FIG. 1.

FIGS. 1 and 2 show a fluid measuring or fluid control device 10 having a housing 12.

In this example, the fluid measuring or fluid control device 10 is a mass flow meter operating in accordance with the Coriolis principle. To this end, two fluid connections 14 are provided in a lower section of the housing 12 in FIGS. 1 and 2 (each closed by plugs in the figures) and are fluidically connected by a measuring tube 16 which is indicated by a dashed line in FIG. 1 and is caused to vibrate in a known manner, which permits the determination of a fluid flow through the measuring tube 16, for example.

The invention may of course also be used for any other types of fluid measuring or fluid control devices.

The housing 12 includes a first housing part 18 and a second housing part 20 connected thereto. The first housing part 18 here forms a housing body, and the second housing part 20 forms a cover, which closes the first housing part 18 from the environment.

The first housing part 18 is here formed to be cylindrical with a rectangular cross-section and defines a longitudinal direction L. Along the longitudinal direction L, the second housing part 20 is clearly shorter than the first housing part 18 and has a cover surface 22 which is oriented perpendicularly to the longitudinal direction L and the form of which approximately corresponds to the cross-section of the first housing part 18.

Both the measuring tube 16 and a suitable control and evaluation electronics (not shown) are for example accommodated in the interior of the first housing part 18. Connections 24 for electric and control lines are provided laterally on one of the narrow sides of the first housing part 18 and are sealed from the environment.

Two openings 30 which are arranged close to a peripheral edge 32 of a peripheral wall 28 are respectively provided on the two opposite broad sides 26 of the peripheral wall 28 of the first housing part 18. The openings 30 of the two sides 26 are opposite each other. The peripheral wall 28 extends parallel to the longitudinal direction L and is circumferentially closed with respect thereto.

Figure 3:
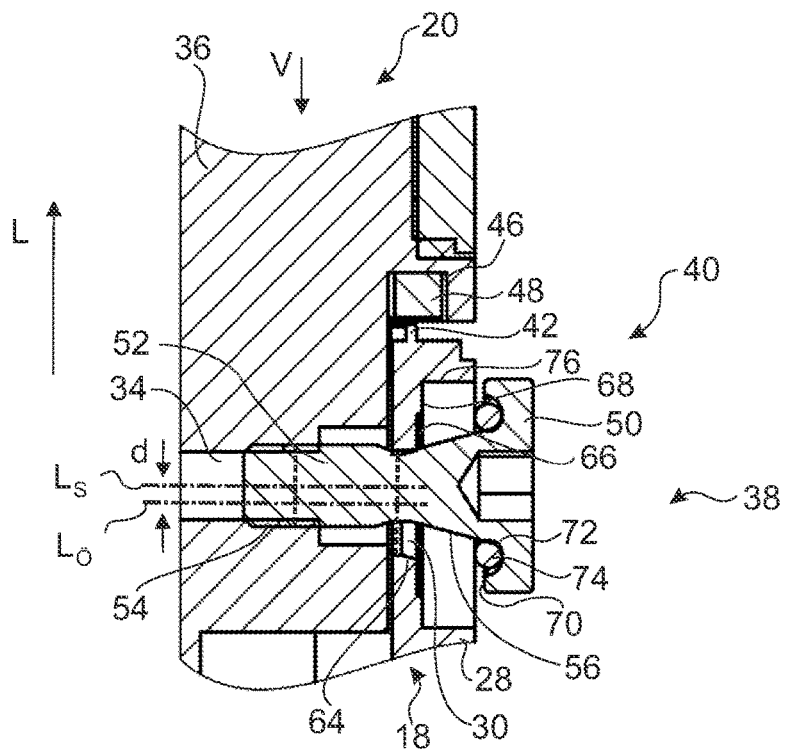
FIGS. 3 to 5 are schematic sectional views of a screwed connection of the fluid measuring or fluid control device from FIG. 1 along the line III-III during tightening of the screwed connection.
Figure 4:
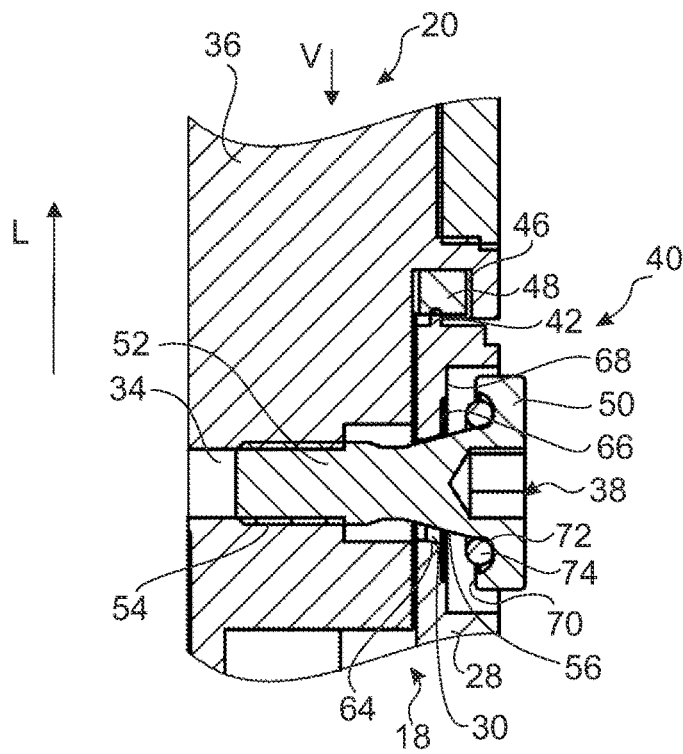
Figure 5:
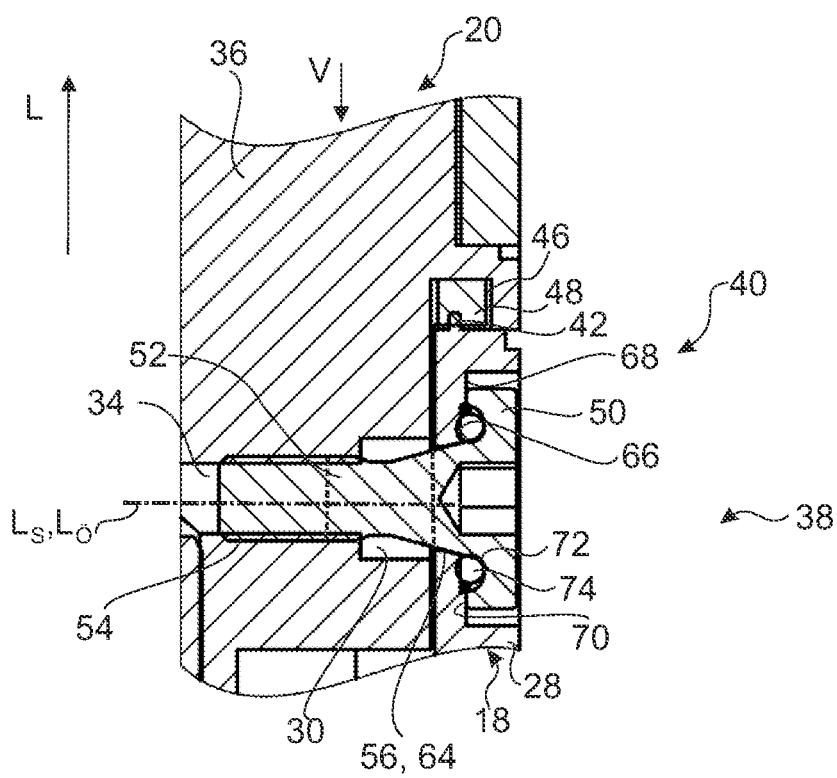

A corresponding threaded opening 34 is respectively provided on the second housing part 20 for each of the openings 30, wherein the openings 30 and the threaded openings 34 overlap when the second housing part 20 is placed onto the first housing part 18 (cf. FIGS. 3 to 5).

In this example, two threaded openings 34 are respectively arranged opposite each other in a fastening block 36, which protrudes perpendicularly from the cover surface 22 of the second housing part 20 (cf. FIG. 2).

One opening 30 and one threaded opening 34 along with a screw 38 respectively form a screwed connection 40. The second housing part 20 is firmly and sealingly connected to the first housing part 18 by tightening all screwed connections 40, in this example a total of four screwed connections.

A first resting face 42, here a peripherally circumferential projection extending in the longitudinal direction L, is formed on the peripheral edge 32. A second resting face 46, here in the form of a peripherally circumferential annular groove, which is opposite the projection, is provided on a cover peripheral edge 44 of the second housing part 18 which faces the peripheral edge 32 of the first housing part 18.

A seal 48 is inserted in the annular groove, which includes a peripherally circumferential edge region 49 the outer contour of which follows the peripheral edge 32.

In this example, the seal 48 is a flat seal which is adapted to the cross-sectional shape of the housing 12 and to the components accommodated in the interior of the housing 12 (cf. FIG. 2).

It would of course also be possible to provide the projection on the second housing part 20 and the annular groove on the first housing part 18, as long as a resting face 42, 46 is arranged on each of the housing parts, such that a circumferential linear or planar contact with the seal 48 is obtained.

The screw 38 comprises a screw head 50 and a screw shank 52. A threaded section 54 which is adapted to the thread of the threaded opening 34 and which can be screwed therein is provided at the free end of the screw shank 52.

Between the screw head 50 and the threaded section 54, the screw 38 includes a frustoconical surface 56 which is widened in the direction towards the screw head 50. Here, an end 58 of the frustoconical surface 56 away from the screw head approximately has the diameter of the threaded section 54.

The opening 30 is completely guided through the peripheral wall 28.

Figure 6:
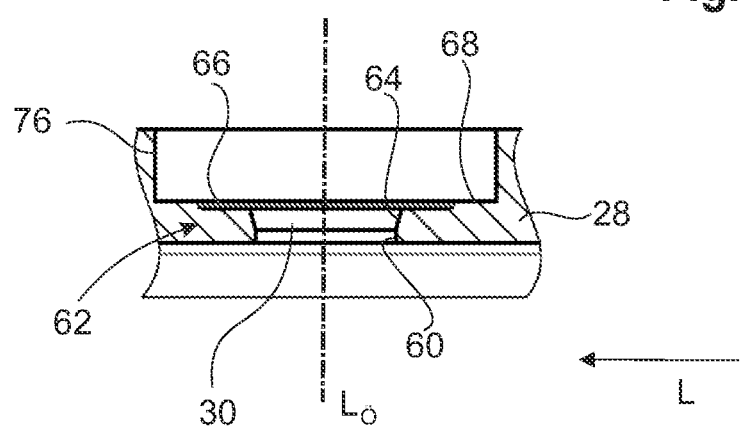
FIG. 6 is a detail of the housing of the fluid measuring or fluid control device in the region of a screwed connection in a sectional view.

FIG. 6 shows a cross-section through the peripheral wall 28 in the area of the opening 30. In the example shown here, as seen from the interior of the housing, a first section 60 of the edge 62 of the opening 30 is circular cylindrical with a diameter only slightly larger than that of the threaded section 54 of the screw 38. The latter is adjoined by a frustoconical surface 64 which widens towards the exterior side of the housing. The other, wider end of the frustoconical surface 64 is surrounded by a first counterbore 66, which in turn is surrounded by a second counterbore 68 of lesser depth (relative to the exterior side of the housing).

The inclinations of the two frustoconical surfaces 56, 64 on the screw shank 52 and on the edge 62 of the opening 30 have the same inclination, for example about 30° with respect to the longitudinal axis $L_S$ of the screw shank 52 or the longitudinal axis $L_{\overline{O}}$ of the opening 30.

The frustoconical surface 56 on the screw shank 52 is here significantly longer than the frustoconical surface 64 on the edge 62 of the opening 30, e.g., by a factor of 3 to 10.

In this example, a second annular groove 72 is furthermore provided on the underside 70 of the screw head 50 facing the screw shank, into which a second seal 74, in this case an O-ring, is inserted.

To connect the second housing part 20 to the first housing part 18, the second housing part 20 is placed on the first housing part 18 in an initial position shown in FIG. 3, and for each of the screwed connections 40, a screw 38 is inserted through one of the openings 30 into the threaded opening 34.

In the initial position, an edge of the screw head 50 close to the second housing part 20 is located outside the second counterbore 68 with respect to the longitudinal direction $L_S$ of the screw shank 52, but is level with the edge 76 of the second counterbore 68 which faces the second housing part 20 with respect to the longitudinal direction L of the housing 12 (cf. FIG. 3).

The frustoconical surface 56 on the screw shank 52 is in contact with the frustoconical surface 64 on the edge 62 of the opening 30, but only in a region facing the second housing part 20. On the opposite side, the frustoconical surface 56 on the screw shank 52 is spaced from the frustoconical surface 64 on the opening 30.

The central axis, i.e., the longitudinal axis $L_S$ of the screw shank 52 and the central axis, i.e., the longitudinal axis $L_{\overline{O}}$ of the opening 30 are parallel to each other, but are radially offset from each other as seen in the longitudinal direction L of the housing 12, the longitudinal axis $L_S$ of the screw shank 52 being offset in the direction towards the second housing part 20. This offset also corresponds to the relative displacement path d of the housing parts 18, 20 relative to each other. The screw shank 52 is of course coaxial with the threaded opening 34, since it is screwed therein.

In this position, the seal 48 in the annular groove on the second housing part 20 is not, or only just, in contact with the projection on the peripheral edge 32 of the first housing part 18, so that the screws 38 can be inserted into the openings 30 and initially screwed into the threaded openings 34 without deforming the seal 48.

This is achieved by appropriately dimensioning the length of the fastening blocks 36 or, more generally, the distance between the threaded opening 34, the resting faces 42, 46, the seal 48 and the position of the openings 30.

If the screw 38 is tightened further, i.e., screwed further into the threaded opening 34, the frustoconical surfaces 56, 64 on the screw shank 52 and on the edge 62 of the opening 30 slide against each other, causing the housing parts 18, 20 to be displaced laterally relative to each other, the second housing part 20 being moved closer to the first housing part 18 in a direction of displacement V along the longitudinal direction L. This is shown in FIG. 4.

As a result, the frustoconical surface 56 on the screw shank 52 moves further towards the peripheral wall 28 of the first housing part 18, so that the screw head 50 begins to dip into the second counterbore 68.

The first resting face 42, i.e., here the projection, is pressed into the seal 48 due to the tensile force that the screw 38 exerts along the longitudinal direction L on the fastening block 36 and via the latter on the entire second housing part 20.

In addition, the material of the second seal 74 below the screw head 50 is elastically deformed and spreads out in the first counterbore 66.

This movement continues until the screw 38 and thus also the screwed connection 40 has reached its fully tightened position, in which further tightening of the screw 38 is no longer possible, as the two frustoconical surfaces 56, 64 lie flat against each other. In this example, the underside 70 of the screw head 50 also rests against the bottom of the second counterbore 68, which serves as a stop, so to speak, for the end of the screwing movement. The two housing parts 18, 20 have travelled the complete displacement path d towards each other, so that now the longitudinal axes $L_S$, $L_{\overline{O}}$ coincide on a straight line. This fully tightened position is shown in FIG. 5.

The displacement path d is determined here by the length of the frustoconical surface 56 on the screw shank 52, while the frustoconical surface 64 on the edge 62 of the opening 30 acts as a guide.

It follows from these specifications that a smallest diameter of the opening 30 here is larger than a diameter of the end 58 of the frustoconical surface 56 of the screw 38 away from the screw head.

The displacement path d is dependent on the cosine of the angle of the frustoconical surface 56 with the longitudinal axis $L_S$ of the screw shank 52, and is therefore always shorter than an axial length of the frustoconical surface 56.

The length over which the projection engages into the seal 48 is chosen to be slightly shorter than the displacement path d, so that the second housing part 20 can be placed on the first housing part 18 in the fitted position without being obstructed by the projection of the first resting face 42.

In this way, all screwed connections 40 on the housing 12 are tightened up to their fully tightened position.

This arrangement ensures a dustproof and watertight connection between the two housing parts 18, 20, which fulfils the requirements of protection rating IP65 and even protection rating IP67.

If the housing 12 is to be opened, all screwed connections 40 are loosened again and the screws 38 removed, as a result of which the second housing part 20 can be removed from the first housing part 18. The two housing parts 18, 20 can be reconnected in the way described above, the seal 48 having to be replaced if necessary.

The invention claimed is:

1. A fluid measuring or fluid control device, having a housing including a first and a second housing part fastened to each other by at least one screwed connection, the screwed connection comprising a screw having a screw shank and a screw head, an opening in a peripheral wall of the first housing part through which the screw shank engages, and a threaded opening in the second housing part which receives the screw shank, wherein an elastic seal having a peripherally circumferential edge region is arranged between the housing parts, and the first housing part has a first resting face and the second housing part has a second resting face, wherein in a non-assembled initial position, one of the housing parts has its resting face resting against the seal, and wherein the screw shank and an edge of the opening have cooperating frustoconical surfaces, wherein in the initial position, the opening in the peripheral wall and the threaded opening are radially offset to each other with their central axes and the frustoconical surfaces are oriented such that upon screwing-in, the frustoconical surfaces displace the two housing parts laterally to each other so that the resting face presses against and elastically deforms the seal.

2. The fluid measuring or fluid control device according to claim 1, wherein the first resting face on the first housing part is a peripherally circumferential projection which engages in the seal in a fully tightened position of the screwed connection.

3. The fluid measuring or fluid control device according to claim 2, wherein a displacement path (d) of the housing parts from the initial position to the fully tightened position is larger than an extension of the projection along a direction of displacement (L).

4. The fluid measuring or fluid control device claim 1, wherein the second resting face on the second housing part is a peripherally circumferential annular groove into which the seal is inserted.

5. The fluid measuring or fluid control device claim 1, wherein the frustoconical surface on the screw shank is arranged between a screw head of the screw and a threaded section on the screw shank.

6. The fluid measuring or fluid control device claim 1, wherein a plurality of screwed connections is provided along a periphery of the first housing part.

7. The fluid measuring or fluid control device claim 1, wherein the threaded opening in the second housing part is provided in a fastening block which extends into an interior of the first housing part.

8. The fluid measuring or fluid control device claim 1, wherein a seal is provided on the screw at a lower end of the screw head.

9. The fluid measuring or fluid control device claim 1, wherein the first housing part is a housing body and the second housing part is a cover which closes the housing body from the environment.

10. The fluid measuring or fluid control device claim 1, wherein the fluid measuring or fluid control device is part of a mass flow meter according to the Coriolis principle, which includes two fluid connections and a measuring tube through which fluid flows and which fluidically connects the two fluid connections to each other.

* * * * *